United States Patent
Chainer et al.

(10) Patent No.: US 7,751,924 B2
(45) Date of Patent: Jul. 6, 2010

(54) C4NP SERVO CONTROLLED SOLDER FILL HEAD

(75) Inventors: Timothy J Chainer, Putnam Valley, NY (US); Peter A Gruber, Mohegan Lake, NY (US); Dennis G Manzer, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 11/830,349

(22) Filed: Jul. 30, 2007

(65) Prior Publication Data
US 2009/0037016 A1 Feb. 5, 2009

(51) Int. Cl.
*G06F 19/00* (2006.01)
*H01L 23/544* (2006.01)
*B23K 31/02* (2006.01)
*B23K 35/36* (2006.01)

(52) U.S. Cl. .................... 700/146; 228/180.1; 228/190; 228/262.31; 228/262.42; 257/620

(58) Field of Classification Search ................. 257/620; 700/146; 228/56, 180.1, 190, 262.31, 262.42
See application file for complete search history.

(56) References Cited
OTHER PUBLICATIONS

Gruber et al., "Low-Cost Wafer Bumping" 2005 IBM. p. 621-639.*
Laine et al., "C4NP-Lead Free Flip Chip Solder Bumping Manufacturing and Reliability Data" 2006 IEEE, p. 1-8.*

* cited by examiner

*Primary Examiner*—Ramesh B Patel
*Assistant Examiner*—Thomas H Stevens
(74) *Attorney, Agent, or Firm*—Michael J. Buchnenhorner; Daniel P. Morris

(57) ABSTRACT

An apparatus for placing solder bumps on a mold plate includes: a solder fill head configured for dispensing molten solder onto the mold plate, the solder fill head also configured for relative movement over the mold plate; and a control mechanism configured for controlling positions of the solder fill head relative to the mold plate. The control mechanism includes: a control input signal containing data about an ideal positioning of the solder fill head; a plurality of sensors positioned on the solder fill head, the sensors configured for providing data about a gap between the solder fill head and the mold plate; a position controller configured for receiving the gap data and comparing the gap data with the control input signal, wherein the position controller provides an inequality signal if the gap data and the control input signal are not equal; an amplifier configured for receiving the inequality signal and amplifying it; and an actuator configured for receiving the amplified inequality signal and controlling movement of the solder fill head in response to the inequality signal received. The control mechanism may be a servo control mechanism. The sensors may be gap sensors.

20 Claims, 5 Drawing Sheets

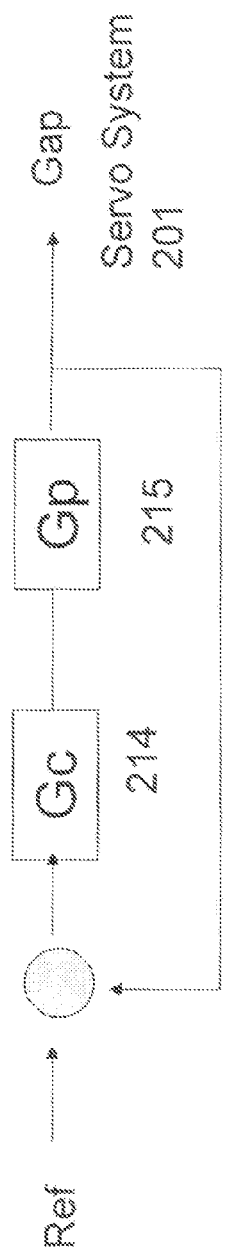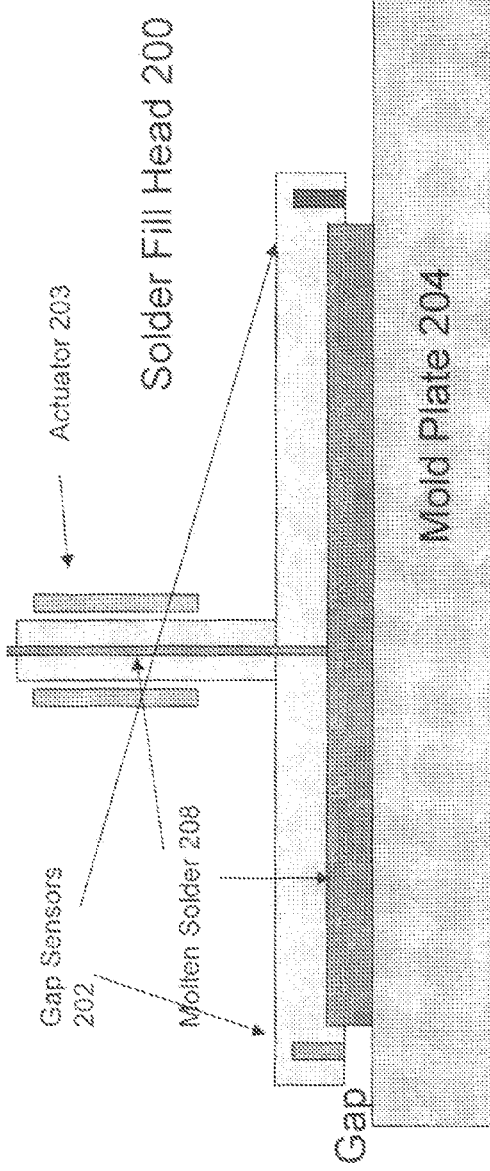
Fig 2

C4NP SERVO CONTROLLED SOLDER FILL HEAD

CROSS-REFERENCE TO RELATED APPLICATIONS

None.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

Not Applicable.

FIELD OF THE INVENTION

The invention disclosed broadly relates to the field of semiconductor packaging technology and more particularly relates to the process of creating solder bumps for integrated circuit wafers using gap sensors.

BACKGROUND OF THE INVENTION

The face-down soldering of integrated circuit (IC) devices to chip carriers, known as "flip-chip packaging" has been used in the semiconductor manufacturing process for forty years. Injection Molding Soldering (IMS) is a technique developed by International Business Machines Corporation (IBM) to address the cost vs. quality issues associated with current wafer bumping technologies. IMS as applied to wafer bumping has been dubbed C4NP (Controlled Collapse Chip Connection New Process) and is a recent semiconductor packaging technology developed by IBM for putting C4 solder bumps onto chips at the wafer level using a lead-free solder. This process is sometimes known as "C4 wafer bumping." C4NP involves filling specially designed pits in a solder mold (mold plate) using a fill head which injects molten solder onto the mold plate.

The multiple etched cavities on a mold plate match the pattern of solder bumps (the "bond pads") required on a wafer. The cavity size and spacing determine the solder bump volume and pitch. The cavities give precise control of bump solder volume, resulting in excellent bump height uniformity. Typical applications might call for 75-µm diameter bumps on a 150-µm pitch. Smaller bumps down to 25-µm in diameter on a 50-µm pitch have been demonstrated, matching the fine-pitch capability of electroplated bumps. For a higher board-to-die standoff, jumbo BGA solder bumps could be molded to 500-µm diameter.

The mold plate is typically constructed of borosilicate glass. In selecting a material for the mold plate the Coefficient of Thermal Expansion (CTE) must be taken into consideration. For example, the thermal expansion of the glass mold matches the thermal expansion of the silicon wafer. Other materials may be used, provided the CTE is taken into consideration. The mold plate is heated to just below the melting point of the solder. The solder is typically constrained to the head and operating area by an o-ring that is compressed between the fill head and the mold plate.

Molten solder is injected into the mold plate cavities through a dispenser. The injector includes a slightly pressurized reservoir of molten solder of any composition. The filling head automatically fills all cavities in the mold, maintaining close contact with the mold plate. The cavities are uniformly filled with the molten solder to the level of the mold plate surface. Once the mold plate is filled the solder is transferred to create C4 bumps on a wafer.

In creating the solder bumps, often the fill head is secured to a moving arm which moves over and above a mold plate carrier (a belt or platform) where the mold plates are positioned and ready for filling. The fill head moves in one direction. Alternatively, the fill head remains stationary and it is the mold plate carrier which moves in one direction. The fill head remains stationary but it is considered to exhibit "relative" movement, rather than actual movement, with respect to the mold plate carrier.

The fill head must make contact with the mold plate to prevent solder leakage, yet it must provide a small gap to allow for air to escape. Pressing down too hard on the mold plate prevents solder leakage, but does not allow for air to escape which may result in deformation of the solder balls.

There is a need for an improved method of C4 wafer bumping to control the gap between the fill head and the mold plate in order to overcome the shortcomings of the prior art.

SUMMARY OF THE INVENTION

Briefly, according to an embodiment of the invention, an apparatus for placing solder bumps on a mold plate includes: a solder fill head configured for dispensing molten solder onto the mold plate, wherein the solder fill head is also configured for relative movement over the mold plate; and a control mechanism configured for controlling positions of the solder fill head relative to the mold plate. The control mechanism includes: a control input signal containing data about an ideal positioning of the solder fill head for maintaining a predetermined height of a gap between said solder fill head and the mold plate; and at least one sensor positioned on the solder fill head, the at least one sensor for providing position feedback of an actual gap height between the solder fill head and the mold plate; a position controller configured for receiving the position feedback and comparing it with the control input signal The position controller provides an inequality signal if the position feedback and the control input signal are not equal. The apparatus also includes an amplifier for receiving the inequality signal and amplifying the signal; and an actuator for receiving the amplified inequality signal and controlling movement of the solder fill head in response to the inequality signal received. The control mechanism may be a servo control mechanism. The sensors may be gap sensors.

According to an embodiment of the present invention, a method for placing solder bumps on a mold plate includes steps or acts of: receiving one or more control input signals comprising a desired position of a solder fill head over the mold plate; receiving a signal from at least one of a plurality of sensors located at different points on the solder fill head, the signals including data about a gap between the solder fill head and the mold plate; comparing the data from the at least one of the plurality of sensors to the control input signal; and driving an actuator located on the solder fill head to change positions of the solder fill head if the gap data and the control input signal do not match. The actuator changes the position of the solder fill head responsive to which one of the at least one of the plurality of sensors sent the signal. The method may also include a step of retrieving data from a lookup table, the data for determining an ideal height of the gap.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 2 shows an illustration of a non-contact solder fill head system with position sensors, according to an embodiment of the present invention;

Figure 1:
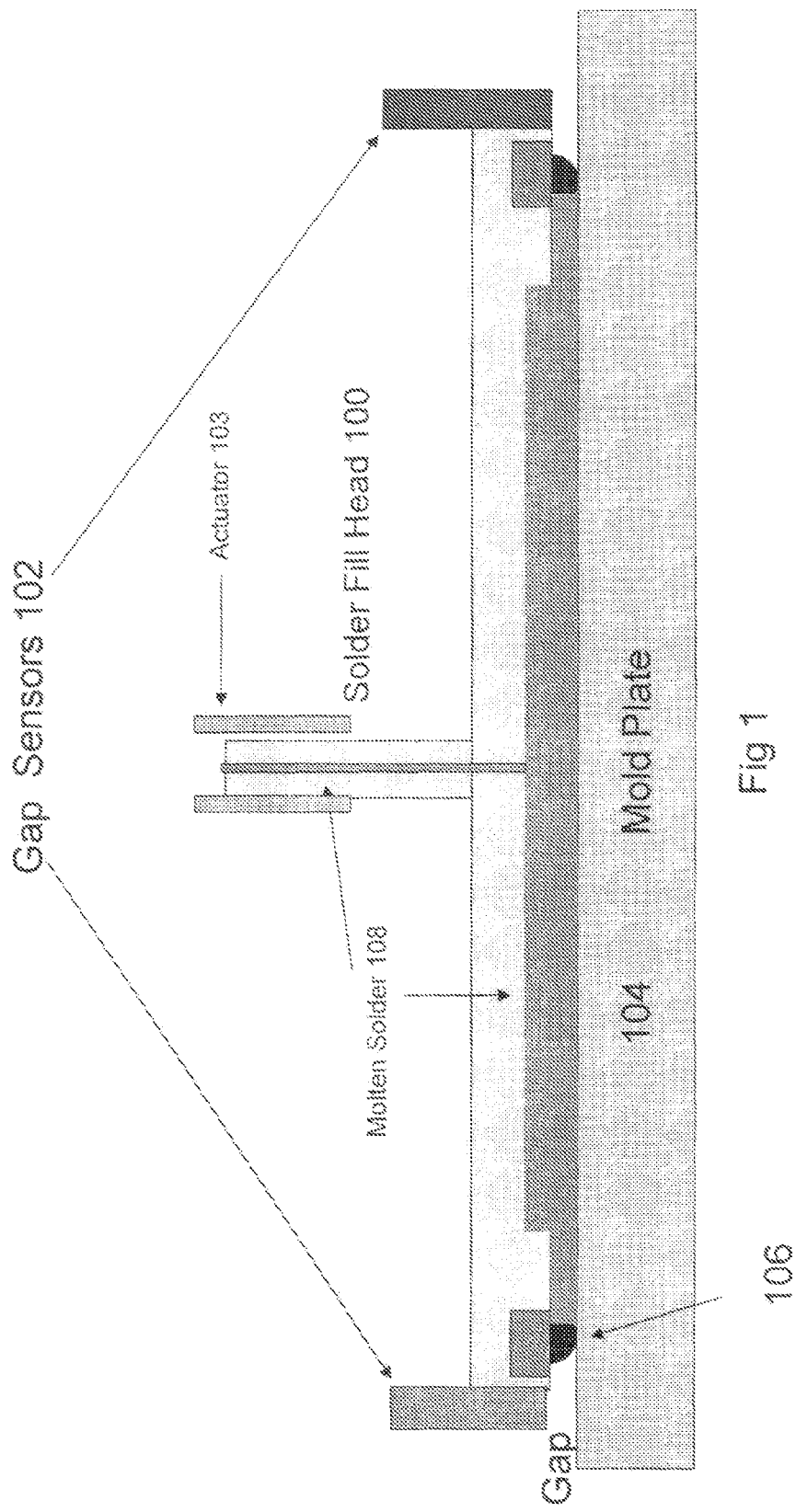
FIG. 1 shows an illustration of a front view of a solder fill head with position sensors in full contact with a mold plate, according to an embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

A method of creating C4 interconnects (solder bumps) uses an injection molded solder tool with position sensors deployed on the solder fill head. The sensors are actively used to provide position feedback for controlling the solder-head to mold distance, or gap. The gap must be controlled in order to prevent solder leakage while simultaneously allowing air to escape from the mold.

Referring now in specific detail to the drawings, and particularly FIG. 1, there is shown an illustrative cross-section of a solder fill head 100 which is in physical contact with the mold plate 104 through the O-ring 106. Contact in this context refers to O-ring seals in the solder head 100 being in contact with the mold plate 104, keeping the solder 108 contained within the O-ring 106. This solder fill head 100 incorporates gap sensors 102 and an actuator 103 and also incorporates a servo mechanism to maintain a predetermined gap between the solder fill head 100 and the mold plate 104.

A servo mechanism, also referred to simply as "servo," as defined herein is a feedback system which includes a sensor and motor to control the motion of a physical plant. The most common type of servo, as used in this embodiment, gives positional control.

The servo system as used in this embodiment receives position sensor input to compare that to the control input (the desired height of the gap). The control input is generally received as signals indicating the desired gap height. An error signal calculated form the difference between the measured and desired gap is input to a servo controller which in turn drives the actuator 103, thereby adjusting the position of the fill head 100 to adjust the height of the fill head 100 to achieve a position as close to the ideal gap as possible.

The actuator 103 can be any form of displacement generating device: one which generates force, increases down pressure, or actual displacement. FIG. 1 shows a single actuator 103 for height positioning. But more actuators might be added to compensate for errors in more than one degree of freedom. Servo control mechanisms, including actuators, are known in the art; therefore, a more detailed discussion of their operation is not necessary.

For purposes of this discussion of the system we assume that the solder head 100 is perfectly flat, as is the mold 104 to be filled. Of course, these are ideal situations which are not always realized and other degrees of freedom may be controlled to accommodate variation in the mold and solder head flatness.

The O-ring 106 acts as a seal to prevent solder leakage. The O-ring 106 also provides solder containment. When the O-ring 106 moves across the mold plate 104 it acts as a wiper to remove excess solder 108 over the surface of the plate 104 without disturbing the solder 108 in the cavities. This eliminates the need to incorporate a separate wiper into the fill head mechanism. The O-ring 106 is preferably a concentric conformable material such as rubber which does not adhere to the mold plate 104. The contact patch (compressed area) of the O-ring 106 provides somewhat of a solidification zone.

In this first embodiment the gap sensors 102 are mounted on the solder fill head 100 to measure the gap between the fill head 100 and the mold plate 104. The solder fill head 100 is in physical contact with the mold plate 104 via O-rings 106 which provide a seal for the molten solder 108, trapping the solder 108 within the entire circumference of the O-ring 106. A wide variety of gap sensors 102 are possible and known to those skilled in the art of position and differential position sensing. The only caveat is that these sensors 102 must withstand the high temperatures of an industrial solder system.

An ideal gap may depend on many criteria. In one case this may be a fixed gap, but other gap profiles are possible, depending for example on the number of pits to be filled at any given instant. A gap profile could be desired for example if there was a predetermined variation in mold cavity depth across the mold plate, or mold to mold variations in cavity depth. This changes as the solder head 100 moves over the mold plate round fill area. An ideal gap is one which fills the cavities in the mold by allowing any gas in the mold 104 to vent under the O-ring seal 106 by being pushed out by the solder pressure. Too much downward pressure on the head 100 can prevent venting, while too little can result in solder leaking under the seal 106 and so ruining the mold's product for that run. Note that the movement of the solder head 100 vis-à-vis the mold plate 104 is relative. Either the solder head 100 and/or the mold plate 104 may actually be in motion thereby producing a relative motion of the fill head 100 over the mold plate 104.

In the case where the mold 104 and fill head 100 are perfectly flat then the solder fill head width would be sufficiently wide to cover the mold 104. In the case where either the mold plate 104 or fill head 100 are not perfectly flat then the width of the servo controlled head 100 would be determined by the mold plate planarity to ensure a uniform gap between the head 100 and mold plate area 104 corresponding to the head width while servo controlling with one or more gap sensors 102. In the case where the fill head width is less than the mold plate width, the fill head 100 would need to make several passes over the mold plate 104. In addition, the fill head 104 can be made compliant to accommodate mold unevenness—the overall gap as measured by multiple sensors, for example in each corner of the solder fill head 400, would still be controlled. The sensors would be located at the edge of the solder fill head where there are no corresponding mold cavities.

Figure 4:
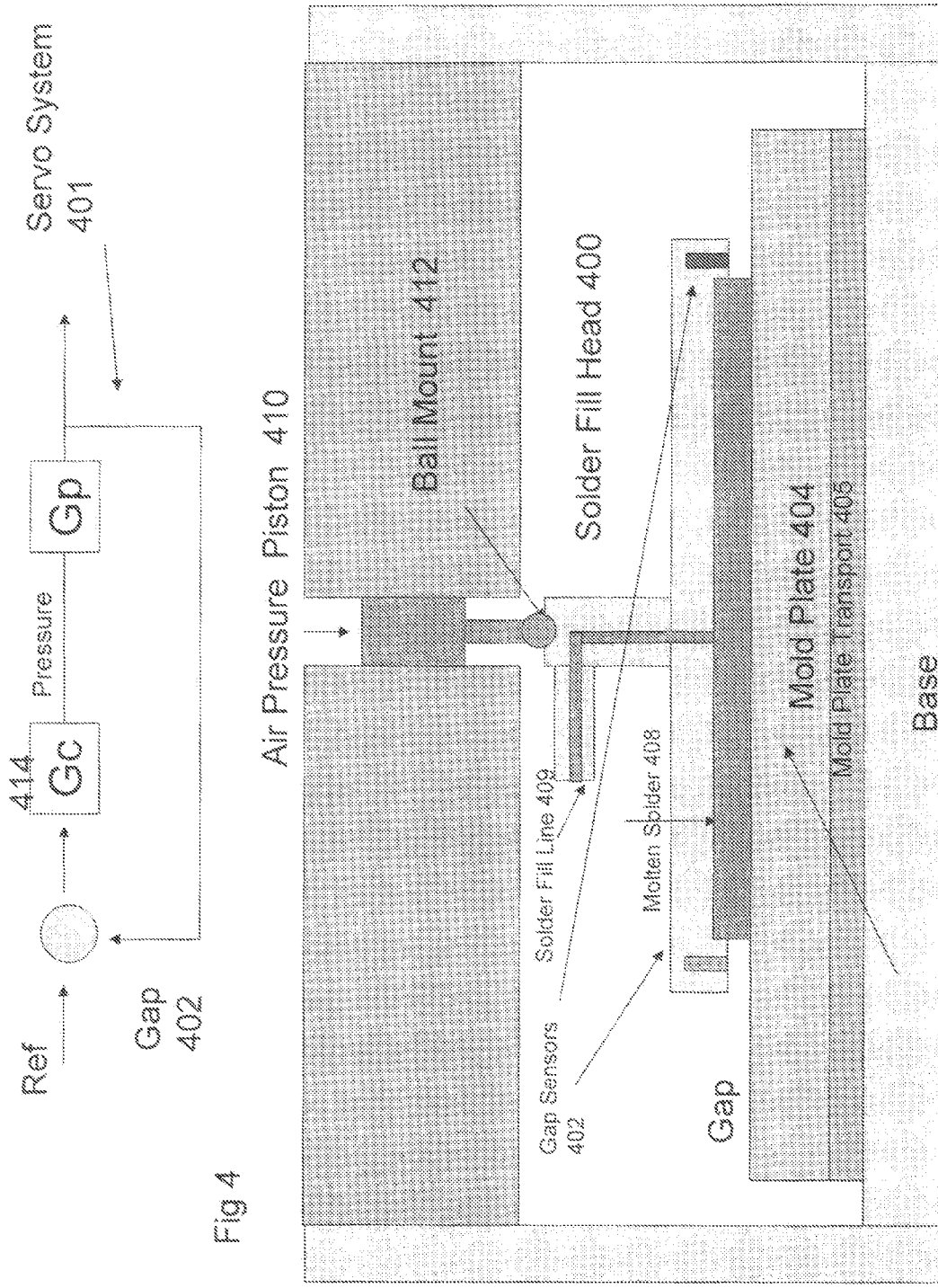
FIG. 4 shows an example of a solder fill head configured to operate according to an embodiment of the present invention.

Referring to FIG. 4, we show one example of the solder head 100 of FIG. 1. FIG. 4 shows a basic IMS filling head 400 for dispensing molten solder onto a mold plate 404. The solder fill head 400 contains a movable plunger 410 for exerting pressure on the solder fill head 400. A solder fill line 409 contains the molten solder 408 which is dispensed by the solder fill head 400. The temperature of the molten solder 408 is typically maintained at 10° to 20° Celsius above the solder melting point.

To inject solder 408 into a cavity, pressure is exerted on the solder fill line 409 forcing the molten solder 408 through the solder fill head 400 and into a cavity in the mold plate 404. In this figure the mold plate 404 is shown moving front to back. The cavities would be filled as the mold plate 404 translates under the solder fill head 400.

The ball joint 412 is a "ball in socket" coupling mechanism which allows for the application of a force while simultaneously allowing the solder fill head 400 to orient to the mold plate 404. This is useful if the mold plate 404 is not parallel to the solder head 400 in either the X (right to left) or Y (front to back) directions. In this situation, the solder fill head 400 needs to tilt in those directions to align to the mold plate 404. The ball joint 412 allows the solder fill head 400 to tilt at the same time that a downward force is applied. Without allowing for compliance of the solder fill head 400 in the X and Y directions, then the solder fill head 400 would have a large gap variation due to misalignment. In the case of the O-ring embodiment, this would prevent the O-ring from uniformly compressing against the surface. In the non-contact embodiment the gap variation due to the misalignment could be much larger than the gap we are attempting to servo and we would not be able to achieve a desirable small gap. The servo system 401 uses positional data from the gap sensors 402 as input to its dynamic control compensator 414.

In a second embodiment a solder fill head 100 which is in physical contact with the mold plate 104 incorporates height sensors 402 and a servo control system 401 to maintain a predetermined force between the solder fill head 100 and mold plate 104, just as in the first embodiment of FIG. 1. However, in this second embodiment, the force of the solder fill head 100 onto the mold plate 104 can be determined by measurement of the gap using the gap sensors 102 and the predetermined compressive force versus height response of the O-ring 106.

In an O-ring 106 made from an electrometric compound, the force verses displacement and solder pressure curves can be measured and stored into a table. A measurement of the gap can be converted to force by using the stored table. A servo system could be used to provide a fixed or predetermined force profile. Alternatively, the gap position sensors 102 might be replaced with force or pressure sensors, accomplishing the same end, i.e., solder containment and air venting.

In a third embodiment of the invention a non-contacting solder fill head which incorporates sensors are used with a servo control system to provide a predetermined gap between the solder fill head and the mold plate. In this case there is no O-ring and the only contact of the head with the mold plate is the liquid solder. A controlled gap of typically less than five microns would allow any gas to escape under the solder fill head while simultaneously sealing against solder flow, meeting both specifications for the head. Solder does not escape the narrow gap because of surface tension of the liquid solder.

FIG. 2 shows the third embodiment wherein a position signal 202 is input to a servo system 201 which controls an actuator 203 to maintain a gap between the solder fill head 200 and mold plate 204. In this way the height of the solder head 200 is as close to an ideal gap as possible. This gap is so small that solder 208 cannot escape, but any gas can easily escape as the solder 208 fills the mold pits. In this embodiment, the ideal gap height is set smaller than the first embodiment because there is no O-ring.

FIG. 2 also shows a block diagram of the plant, Gp 215 which includes the actuator 203 and solder fill head 200 and Gc 214, a dynamic control compensator, designed to improve the performance of the mold fill process by using the feedback from the position sensors 202.

Figure 3:
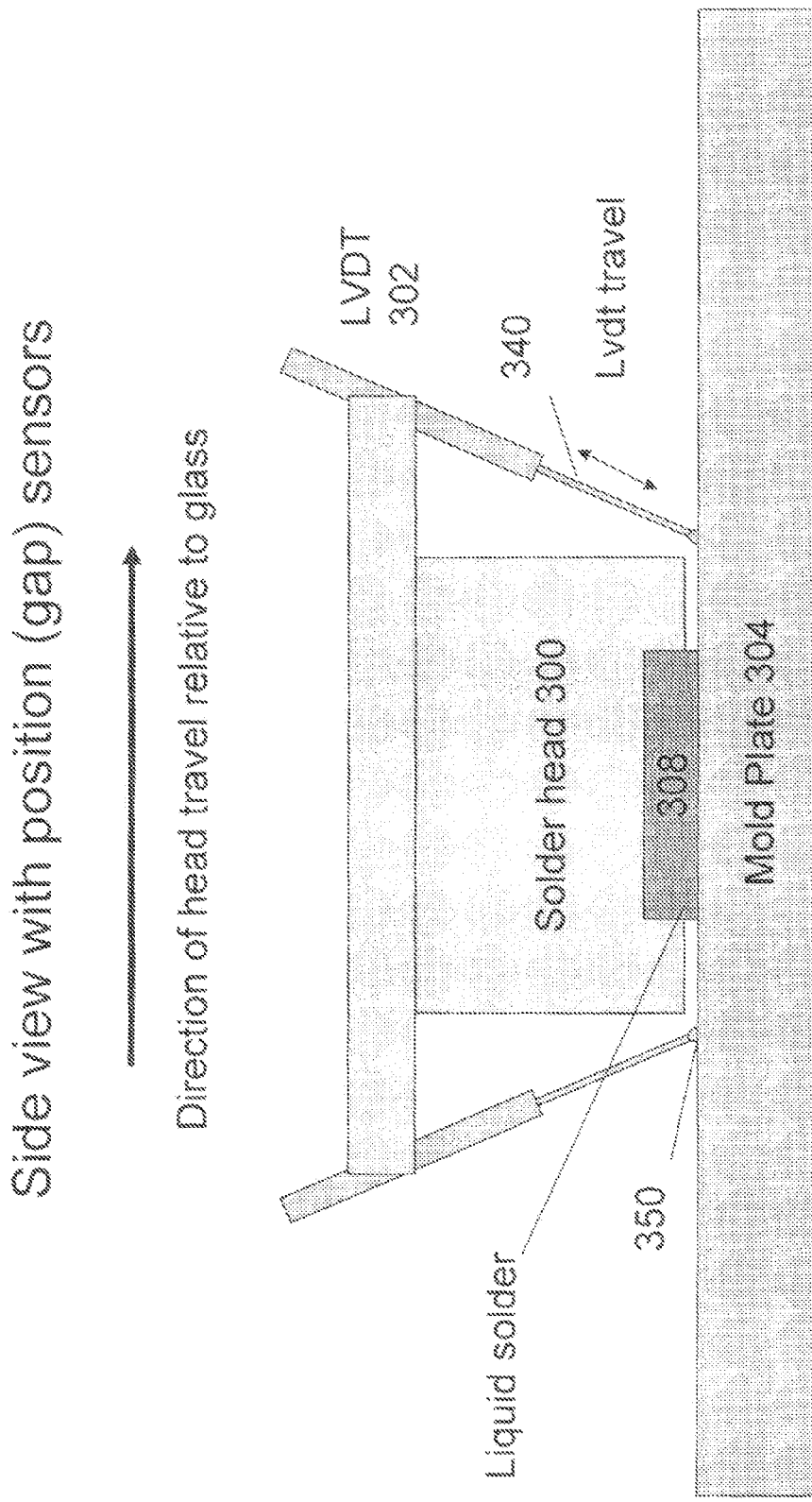
FIG. 3 shows an illustration of a side view of a solder fill head system using LVDT sensors, according to an embodiment of the present invention.

Referring to FIG. 3 there is shown a side view illustration of a solder fill head system 300 using LVDT position sensors 302. LVDT, or Linear Variable Differential Transformer, position sensors can be used for measuring the height above the mold glass 304. While there are many sensing methods, LVDTs provide an advantage in that they have been built to withstand the high temperatures of the solder tool, are inexpensive, and give very precise information about height. The position information for feedback is resolved to a sub-micron resolution. With four such sensors 302 on the corners of the head 300 (note only two are shown), height and tilt of the head 300 can be measured and compensated for by the appropriate actuators.

The illustration of FIG. 3 is a side view showing two of the four LVDT sensors 302 mounted on the fill head 300, used to measure solder head position for dispensing molten solder 308. Connected to the sliding differential transformer encased in a stainless steel shell are four stainless steel push rods 340 tipped with rounded stainless steel balls 350. These balls 350 slide along the mold glass surface, outside the pit area, and thus encounter only smooth glass. Note that the rods are mounted on the edges of the fill head 300 where they will not encounter pits.

The rods 340 need to be angled inward to have enough clearance from equipment mounted on the head 300 but still make contact with the parking spaces for the head 300. This roughly 20 degree angle can be easily compensated for mathematically to derive the true head height. With four position sensors 302 at the corners of the head 300, head height, tilt, and to some degree warping of the head due to temperature, can be detected and compensated.

During the filling of the mold 304, the data from the LVDT sensors 302 gives a time history of the heights observed at the corners. The corners are observed because there are no pits in the corners. With proper dynamic modeling, these time histories can be used to deduce in even greater detail the flying height of the head 300 and its interaction with the glass mold 304. From these, more ideal control laws may be designed to improve the fill of the mold pits.

Improvement can be defined as a greater, more uniform yield of solder balls, a reduction in solder leaking of solder from the head, and fewer defective balls due to poor venting of air (with or without an O-ring seal). For example, as a mold wide solder head progresses across the mold, it encounters more and more chip sites to be filled on the round active area of the mold. Good fills might necessitate an increase in solder pressure and close maintenance of the gap to insure the increased amount of gas can escape without having solder escape as well. Such process control could be crucial for having consistently filled solder mold pits with low rates of error. Only a few bad solder balls per million is acceptable.

Figure 5:
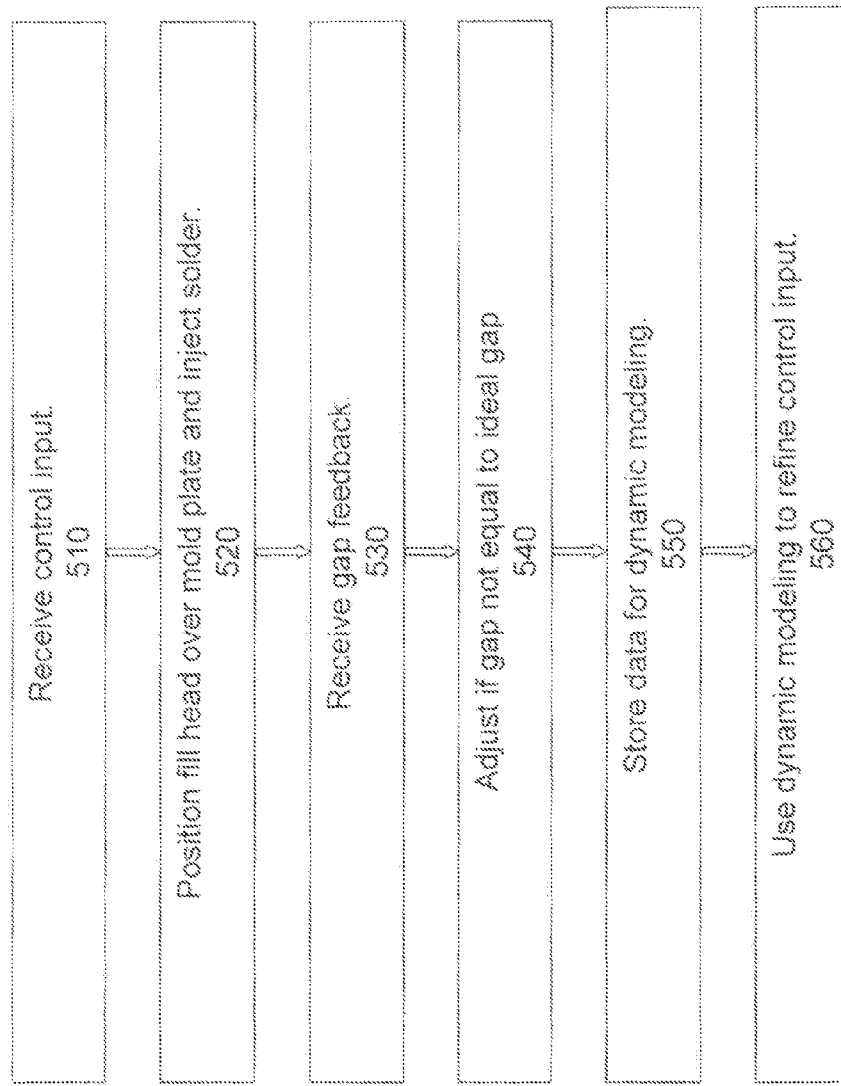
FIG. 5 is a flow chart of the method for creating solder bumps, according to an embodiment of the present invention.

Referring to FIG. 5 there is shown a flow chart of the method steps performed in the embodiments as described above. In step 510, a control input is received. This control input is a measurement of the perceived ideal positioning of the fill head relative to the mold plate. This control input is subject to change.

Next in step 520, the fill head is positioned over the mold plate and the molten solder is injected. The fill head relatively moves over the mold plate and from mold plate to mold plate. This movement over different surfaces requires re-positioning of the fill head. Therefore, in step 530, gap sensors provide position feedback. According to the feedback provided, the position/height of the fill head may need to be adjusted in step 540. This adjustment is controlled by an actuator. The adjustment is performed according to the determined difference between the ideal gap and the actual gap.

Optionally, in step 550, the positional data can be stored in a table. Dynamic modeling of the flying height of the fill head over the mold plate can be produced from the data stored in this table. In step 560, this dynamic modeling can be used to refine the control input. This may encompass generating customized control input for different mold plates, rather than using the same gap height for all mold plates.

Therefore, while there has been described what is presently considered to be the preferred embodiment, it will understood by those skilled in the art that other modifications can be made within the spirit of the invention. The above descriptions of embodiments are not intended to be exhaustive or limiting in scope. The embodiments, as described, were chosen in order to explain the principles of the invention, show its practical application, and enable those with ordinary skill in the art to understand how to make and use the invention. It should be understood that the invention is not limited to the embodiments described above, but rather should be interpreted within the full meaning and scope of the appended claims.

The invention claimed is:

1. An apparatus for placing solder bumps on a mold plate, the apparatus comprising:
    a solder fill head for dispensing molten solder onto the mold plate, and for relative movement over said mold plate; and
    a control mechanism for controlling positions of the solder fill head relative to the mold plate, said control mechanism comprising:
        an input for receiving a control input signal comprising data about an ideal positioning of the solder fill head for maintaining a predetermined height of a gap between said solder fill head and the mold plate for preventing solder leakage while simultaneously allowing air to escape from the mold plate;
        at least one sensor for providing position feedback comprising an actual gap height between the solder fill head and the mold plate;
        a position controller for receiving the actual gap height and comparing the actual gap height with the predetermined gap height from the control input signal, wherein said position controller provides an inequality signal if the actual gap height and the predetermined gap height from the control input signal are not equal;
        an amplifier for receiving the inequality signal and amplifying said inequality signal; and
        at least one actuator for receiving the amplified inequality signal and controlling movement positioning of the solder fill head in response to the inequality signal received for maintaining the predetermined gap height.

2. The apparatus of claim 1, wherein the control mechanism comprises a servo control mechanism.

3. The apparatus of claim 1, wherein the at least one sensor comprises a gap sensor.

4. The apparatus of claim 1, wherein the control mechanism comprises a ball joint coupled to the solder fill head for enabling the solder fill head to tilt while a downward force is applied to the solder fill head.

5. The apparatus of claim 2, further comprising an o-ring affixed to the solder fill head and wherein the control input signal comprises information identifying an ideal force to be exerted relative to the gap height of the gap, wherein the ideal force is determined by measurement of the gap and a predetermined compressive force versus displacement of the o-ring.

6. The apparatus of claim 5 further comprising a lookup table for storing a representation of a predetermined compressive force versus displacement of the o-ring and solder pressure curves of the o-ring.

7. The apparatus of claim 1 wherein the solder fill head is compliant.

8. The apparatus of claim 1 wherein the at least one sensor is positioned at a corner edge of the solder fill head.

9. The apparatus of claim 8 wherein the at least one sensor comprises a linear variable differential transformer positioned at the corner edge of the solder fill head, the linear variable differential transformer comprising a rod tipped with a stainless steel ball, wherein the rod is angled inward toward the solder fill head.

10. The apparatus of claim 9 wherein the at least one sensor detects fill head height, fill head tilt, and warping of the solder fill head.

11. The apparatus of claim 1 wherein the solder fill head is not in contact with the mold plate.

12. A method for placing solder bumps on a mold plate, the method comprising steps of:
    receiving control input comprising a desired position of a solder fill head over the mold plate, wherein said desired position comprises a predetermined height of a gap between said solder fill head and said mold plate for preventing solder leakage while simultaneously allowing air to escape from the mold plate;
    injecting solder onto the mold plate;
    receiving a signal from at least one of a plurality of sensors located at different points on the solder fill head, the signal comprising positional data referencing an actual height of the gap between said solder fill head and the mold plate;
    comparing the positional data from the at least one of the plurality sensors to the control input signal; and
    driving an actuator located on the solder fill head to change positions of said solder fill head if the positional data and the control input signal do not match,
    wherein the actuator changes the position of said solder fill head responsive to which one of the at least one of the plurality of sensors sent the signal for maintaining the predetermined gap height.

13. The method of claim 12 further comprising a step of:
    retrieving data from a lookup table, said retrieved data for determining an ideal height of the gap.

14. The method of claim 12 further comprising a step of:
    measuring the gap and a predetermined compressive force versus displacement of an o-ring affixed to the solder fill head, for determining an ideal height of the gap,
    wherein affixing the o-ring to the solder fill head forms a seal, and
    wherein said ideal height allows any gas in the mold plate to vent under the seal, while preventing solder leakage.

15. The method of claim 13 further comprising steps of:
    receiving time histories of heights of the gap as the solder fill head moves in relative motion over the mold plate, the time histories received from linear variable differential transformers; and
    determining the ideal height of the gap using the time histories.

16. The method of claim 14 further comprising a step of:
implementing dynamic modeling to determine the ideal height of the gap.

17. The method of claim 16 further comprising a step of: using the dynamic modeling to produce the control input.

18. The method of claim 12 wherein the received signal comprises data about the gap between the solder fill head and the mold plate.

19. The method of claim 12 further comprising a step of: receiving a gap profile, the gap profile comprising positional data corresponding to a topography of the mold plate, allowing for variations in mold cavity depth.

20. The method of claim 12 wherein the step of receiving the control input comprises receiving signals indicating the desired position of the solder fill head over the mold plate.

* * * * *